United States Patent [19]

Shores

[11] 4,148,543

[45] Apr. 10, 1979

[54] SUPPRESSOR FOR ELECTROMAGNETIC INTERFERENCE

[75] Inventor: Marvin W. Shores, Pomona, Calif.

[73] Assignee: General Dynamics Corporation, Pomona, Calif.

[21] Appl. No.: 901,368

[22] Filed: Apr. 28, 1978

[51] Int. Cl.² .......................... H01R 3/06; H04B 3/28; H05K 9/00

[52] U.S. Cl. .......................... 339/143 R; 174/35 C; 333/12

[58] Field of Search .......... 339/143 R, 143 C, 14 R, 339/91 R, 99 R, 99 A, 99 M, 136 R, 136 M; 179/35 C; 333/12, 95

[56] References Cited

U.S. PATENT DOCUMENTS

| | | | |
|---|---|---|---|
| 3,336,562 | 8/1967 | McCormick et al. | 339/91 R X |
| 3,391,380 | 7/1968 | Robinson et al. | 339/143 R |
| 3,617,607 | 11/1971 | Williams | 333/12 X |
| 3,825,874 | 7/1974 | Peverill | 339/14 R |
| 3,852,700 | 12/1974 | Haws | 339/14 R |

*Primary Examiner*—Roy Lake

*Assistant Examiner*—E. F. Desmond

*Attorney, Agent, or Firm*—Henry M. Bissell; Edward B. Johnson

[57] ABSTRACT

An electrical connector having means for suppressing electromagnetic interference when the connector pins are separated from the pin sockets. To this end, each of the connector pins or each pin socket is contained in an electrically conductive housing. The housing forms an open space about and extending beyond each pin or socket. This open space forms a waveguide having a predetermined upper cutoff frequency. This cutoff frequency depends on the length of the waveguide measured from the tip of each pin or socket to the end of the waveguide and on the diameter or largest dimension of the waveguide, which may be a cylindrical waveguide. Each of the corresponding pin sockets has an outer insulation tube which fits into the open waveguide. Further, each pin socket is provided with a spring contact for making electrical connection to the respective connector pins. The cutoff frequency of the waveguide is selected to be substantially above the highest frequency of the expected electromagnetic interference.

9 Claims, 4 Drawing Figures

SUPPRESSOR FOR ELECTROMAGNETIC INTERFERENCE

BACKGROUND OF THE INVENTION

1. Field of the Invention

This invention relates generally to electric connectors and particularly relates to a pin and pin socket connector having means for suppressing electromagnetic interference when the pin sockets are separated from the pins.

2. Description of the Prior Art

In order to protect sensitive electronic circuits from the effects of electromagnetic radiation, they are usually enclosed in a metallic shield. Such electromagnetic radiation or interference may be generated in the surrounding environment. When electromagnetic radiation is severe, such as aboard ships, aircraft or on land-based transmitter stations, where electromagnetic radiation emitters are in close proximity, the shields must be particularly well designed. They must be "radio-frequency tight". Sometimes they are doubled to insure that the circuit is properly isolated from high level radiation fields.

Generally, electronic circuits which are shielded in this manner must be permanently interconnected by wiring to other shielded enclosures which are necessary to the overall function of the system. These wires or cables in turn must also be shielded by metal-to-metal connections. Otherwise the required overall integrity of the shield cannot be maintained.

Instead of shielding the cables, it ahs also been proposed to filter each line or wire of the cable at the point it enters the shielded enclosure. The effectiveness of such a line filter, however, is limited. It depends very much on the termination impedance at the end of each line which is usually relatively low. In some systems there is a requirement to have temporary test connectors, for example at cable interconnect points. These test connectors must be accessible on the surface of a shielded enclosure. When these connectors are not in use, they are generally covered with a protective shield cap to maintain the shield integrity of the enclosure.

When a missile is launched, the umbilical connector between the missile and the launching station must be removed. This effectively leaves a hole or aperture in the missile skin which operates as a shield. Each open end wire at the open connector now functions as an antenna to pick off electromagnetic radiation. Missile launch generally takes place in an environment having severe electromagnetic disturbances. Furthermore, missile launch is a critical phase of the missile system where shielding is most essential. Filtering of each line or wire at the interface would be ineffective because after the umbilical connector is disconnected, the lines are open ended or not terminated. Hence they exhibit a very high impedance. It might be possible to provide automatically closing connector cover shields on the umbilical opening. However, they are difficult to design, costly to fabricate and install and if they do not work, they do not solve the problem.

The present invention makes use of certain properties of waveguides. That is each waveguide has an upper cutoff frequency and frequencies below cutoff are suppressed. this cutoff frequency suppression factor can be selected by the dimensions of the waveguide.

Many electrical connectors are known to the art. In some of these, an open space may surround the connector pins which would operate as a waveguide. Such an example is shown in the U.S. Pat. No. 3,825,874 to Peverill. This patent discloses an electrical connector where the pin contacts are mounted in open passages. Insulators are provided for the pin sockets. However, this patent does not discuss electromagnetic interference nor any solution for the avoidance of such interference.

Reference is also made to the U.S. Pat. No. 2,915,734 to Alden. FIGS. 4–6 of this patent show a shielded connector configuration of multiple female contacts. Shielding is provided between the various contacts by metallic inserts. Further, the U.S. Pat. No. 1,871,397 to Watts shows female contact pins or pin sockets, each being provided with an outer layer of insulation.

SUMMARY OF THE INVENTION

In accordance with the present invention, each of the connector pins or alternatively, each of the pin sockets is surrounded by an electrically conducting structure forming a housing which provides an open space about each connector pin. This open space operates as a waveguide. It can be so dimensioned depending on the diameter or largest dimension of the cross-section of each waveguide so that the waveguide has an upper cutoff frequency which is substantially above the operating frequency and also above the frequency of the ambient electromagnetic radiation which is expected and which might interfere with the operation of the system. Below the cutoff frequency the waveguide provides substantial attenuation.

Preferably each waveguide is in the form of a cylindrical waveguide having a circular cross-section. The pin sockets or female connections are each provided with an outer insulation layer or tube to protect the pin socket from any effects of the conductive housing of the pins. Each of the pin sockets is provided with a spring contact which may take the form of a leaf spring to contact the corresponding connector pin.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing.

DESCRIPTION OF THE PREFERRED EMBODIMENT

Figure 1:
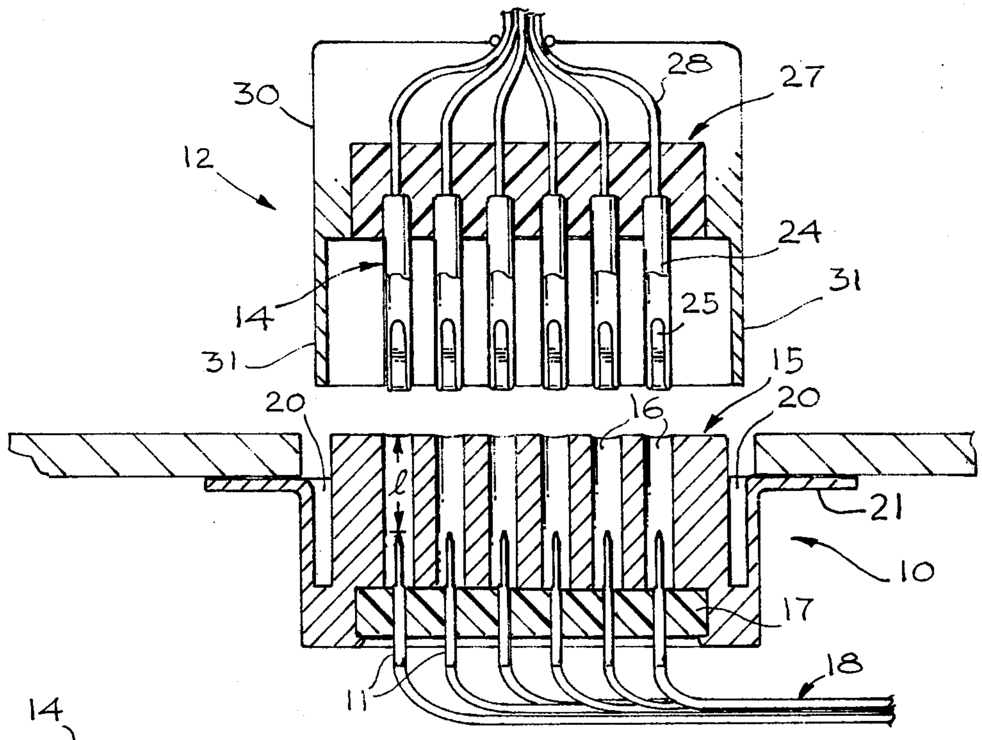
FIG. 1 is an exploded cross-sectional view of a male and female multi-connector structure in accordance with the present invention the male pin sockets of FIG. 1 being taken on line 1—1 of FIG. 3.

Referring now to the drawing, there is illustrated an electrical connector in accordance with the present invention. As shown in FIG. 1, the connector consists of a male portion 10 which encompasses the connector pins 11 and a female portion 12 which includes a plurality of pin sockets 14. The electrical connector is shown disconnected in FIG. 1.

Figure 3:
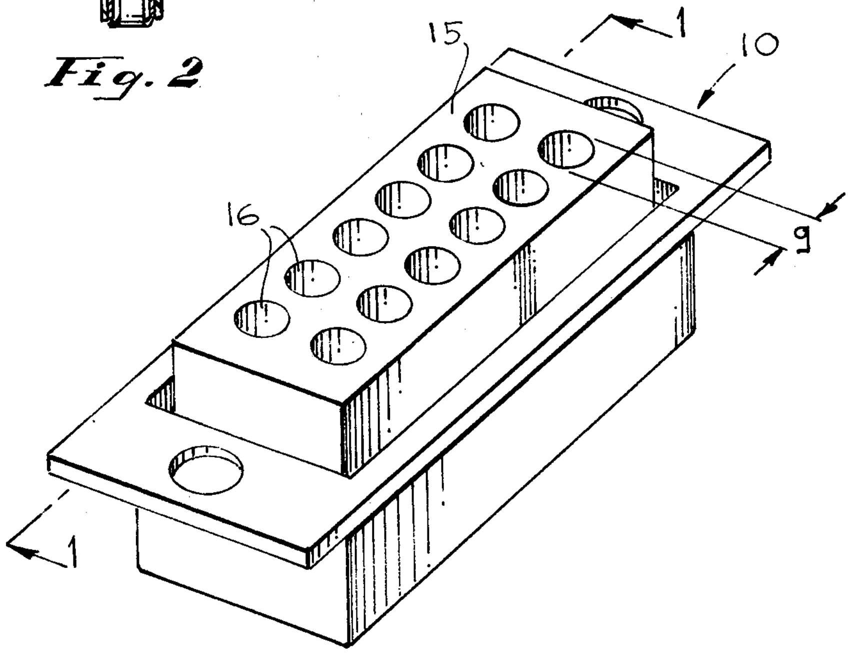
FIG. 3 is a view in perspective of an electrical connector in accordance with the present invention.

The male portion 10 of the connector includes a housing 15 which is made of an electrically conductive material such as solid metal. The housing 15 is provided with a plurality of openings or apertures 16, one for each of the connector pins 11. The pins extend from an insulating base 17. Each of the pins 11 is connected to a wire 18 which in turn leads to the electronic circuit to be protected. In the space outside of the connector pins 11, of which there may be six in each row and as shown in FIG. 3 there may be two such rows, there is provided a recess 20 extending about the pin containing portion of the housing 15. A shielded enclosure 21 extends about the housing 15 to provide the normal shielding for the structure and for mounting the connector male portion 10.

Figure 2:
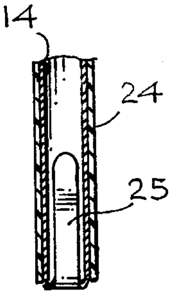
FIG. 2 is an enlarged sectional view of one of the pin sockets of FIG. 1.

The female connector portion 12 includes the pin sockets 14, equal in number to the number of connector pins. Because the connector pins 11 are surrounded by a conductive housing 15, the pin sockets must be insulated therefrom. Therefore, each of the pin sockets is surrounded by an insulating structure or tube 24 as shown more clearly in FIG. 2. The insulated tube 24 may have a shape corresponding to that of the aperture 16 which may have a circular cross-section as shown in FIG. 3. However, it is to be understood that the apertures 16 may also have a square, rectangular, hexagonal or other cross-section. In this case the insulating structure 24 may either have the same cross-section or a circular cross-section to fit the smallest diameter of the apeture 16.

In order to make connections with the connector pins 11, there are provided spring contacts 25 which may be in the form of a leaf spring to interconnect to each of the connector pins 11.

The pin sockets 24 are mounted in a suitable base 27 which preferably is of an insulating material. A plurality of wires 28 extend one each from the pin sockets 14, 25.

The female connector portions 12 may be surrounded by a conducting housing 30 having a thin flat extension 31 to fit into the recess 20 of the main connector portion housing 15.

It will therefore be understood that when the female connector portion 12 is introduced into the male portion 10, a continuous shielding is provided by the shielded enclosure 21 and the conductive housing 30 with its extension 31.

However, when for any reason the feamle connector portion 12 must be removed, for example where it forms the umbilical connector of the missile which must be removed during launch, the male connector portion 10 is no longer shielded from electromagnetic radiation which might cause severe disturbances. Therefore, in accordance with the present invention, the apertures 16 are made in the form of a waveguide or transmission line. Such a waveguide may have a circular, square or rectangular cross-section or even other cross-sections. In accordance with the present invention, these waveguides 16 are so designed that they have an upper cutoff frequency which is well above the operating frequency of the electric circuitry connected to the connector pins 11 and their wires 18.

This cutoff frequency depends on the dimension g as shown in FIG. 3. This is the diameter of a cylindrical waveguide or else the largest diameter of a square, rectangular or hexagonal waveguide or the like. The attenuation obtained by such a waveguide below its cutoff frequency is determined among others by the length l shown in FIG. 1 which is the length in inches between the tip of each connector pin 11 and the outer end of the housing 15. It also depends on the cutoff frequency which in turn depends on the dimension g as in equation (1).

$$f_c = (6200/g) \quad (1)$$

where $f_c$ is the cutoff frequency in megahertz (MHz) and g is the dimension indicated in FIG. 3, in inches.

On the other hand, the attenuation A and decibels (db) are given by the following formula:

$$A = 0.0046(l)f_o\sqrt{(f_c/f_o)^2 - 1} \quad (2)$$

In the above formula l is shown in FIG. 1 and $f_o$ is the operating frequency in megahertz. Thus the attenuation depends not only on l but also on $f_o$ and $f_c$, which in turn depends on g.

Assuming now for example an operating frequency of 14,000 MHz which is in the K-band and further assuming $g=\frac{1}{8}$ inch and $l=\frac{1}{4}$ inch; in this case $f_c=49{,}600$ MHz. Furthermore A equals 55 db.

The above formulas may be obtained from the book by Donald R. J. White entitled "Electromagnetic Interference and Compatibility", Volume 3, § 11.1. Other references dealing with this subject are the book by Frederick Terman (4th edition) "Electronic and Radio Engineering" and the book by Edward L. Ginzton entitled "Microwave Measurements".

It will of course be understood that other dimensions may be selected for different purposes, that is for different operating frequencies and different cutoff frequencies depending on the particular requirements. In general it will be clear that this technique is particularly applicable to operating frequencies within the microwave frequency range.

Figure 4:
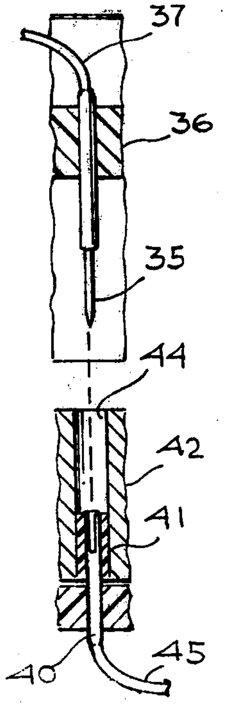
FIG. 4 is an exploded, cross-sectional view of a portion of a modified multi-connector structure similar to that of FIG. 1 but illustrating another embodiment of the present invention.

In accordance with the present invention, it is also feasible to reverse the role of the connector pins and the pin sockets. Such a construction has been illustrated in FIG. 4 to which reference is now made. Here the pins 35 are enclosed in an insulating housing 36. Each pin 35 is provided with an electrical conductor 37 leading to an electronic circuit.

The connector sockets 40 are surrounded by an insulating structure 41 which, in turn, is mounted in a conductive housing 42. The housing 42 provides elongated openings or apertures 44 corresponding to the openings 16, shown in FIG. 1. Hence, the openings 44 form the waveguide previously discussed. Each of the pin sockets 40 is provided with a lead 45 connected to an electronic circuit.

Hence, it will be obvious that the pin sockets as such may be disposed in a waveguide having a desired cutoff frequency.

There has thus been disclosed an electrical connector having provision for suppressing electromagnetic interference. This is effected by surrounding each of the connector pins or pin sockets with an open space which may be considered to be a waveguide or transmission line. The largest width or diameter of such a waveguide determines the upper cutoff frequency which should be selected to be above the operating frequency. This width or diameter in combination with the length of the waveguide between the tip of the connector pin or the pin socket and the outer end of the waveguide as well as the operating frequency jointly determine the attenuation obtainable with such a waveguide. The female connector portion must have provision such as an insulating shield to surround each pin socket so that it will not make contact with the conductive walls of the pin housing.

Although there have been described above specific arrangements for a suppressor for electromagnetic interference in accordance with the present invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the appended claims.

I claim:

1. An electrical connector comprising means for suppressing electromagnetic interference after the pin sockets are removed from the collector assembly, said connector comprising:
- (a) a plurality of connector pins;
- (b) a plurality of pin sockets for interconnecting each of said pins; and
- (c) an electrically conductive housing surrounding each of said connector pins or pin sockets, said housing having a predetermined largest diameter selected in such a manner that the housing surrounding each of said connector pins or pin sockets operates as an electromagnetic waveguide having an upper cutoff frequency which is beyond the highest expected frequency of electromagnetic interference.

2. A connector as defined in claim 1 wherein said conductive housing forms a cylindrical space for each of said conductor pins or pin sockets and provides a cylindrical waveguide.

3. A connector as defined in claim 2 wherein the greatest diameter of the waveguide formed about each connector pin or pin socket is the diameter of the cylindrical waveguide.

4. A connector as defined in claim 1 wherein each of said pin sockets consists of an insulating tube having a shape corresponding to the space about each of said pins, and wherein a spring contact is provided for each of said connector pins to make contact therewith.

5. A connector as defined in claim 4 wherein said housing is provided with recesses at each end of a row of connector pins and wherein said pin sockets are disposed in an electrically conductive socket housing provided at each end thereof with an extension mating with said recesses.

6. A connector as defined in claim 1 wherein the length of each of said waveguides between the tip of its associated pin or socket and the open end of the associated waveguide, the cutoff frequency and the operating frequency of the electric circuit connected to said pin determines the attenuation of each of said waveguides below its cutoff frequency.

7. A connector as defined in claim 3 wherein each of said pin sockets is disposed in one of said waveguides.

8. An electrical connector having means for suppressing electromagnetic interference after the pin sockets have been removed from the connector pins, said connector comprising:
- (a) a plurality of connector pins;
- (b) a metallic housing having a plurality of cylindrical recesses, each of said connector pins being disposed in any of said cylindrical recesses, each of said cylindrical recesses functioning as a cylindrical waveguide having a predetermined length between the open end of each of said connector pins and the open end of each of said waveguides, and having such a diameter that it will have an upper cutoff frequency above the frequency of the highest expected frequency of any electromagnetic interference and a predetermined attenuation depending on said length, said cutoff frequency and the operating frequency of an electric circuit connected to said plug;
- (c) a plurality of pin sockets, each having an insulation tube to insulate the pin sockets from said metallic housing; and
- (d) a spring contact disposed in each of said cylindrical insulation tubes for making electrical contact with one of said connector pins, whereby when said pin sockets are removed from said pins, said waveguide will suppress electromagnetic interference below its cutoff frequency.

9. A connector as defined in claim 8 wherein each of said waveguides has a length of approximately $\frac{1}{4}$ inch and has a diameter of approximately $\frac{1}{8}$ inch, whereby the upper cutoff frequency is approximately 49.6 GHz and wherein the attenuation of said waveguide is approximately 55 db with an operating frequency of 14 GHz.

* * * * *